United States Patent [19]
Salisbury

[11] Patent Number: 5,480,812
[45] Date of Patent: Jan. 2, 1996

[54] ADDRESS LINE REPAIR STRUCTURE AND METHOD FOR THIN FILM IMAGER DEVICES

[75] Inventor: Roger S. Salisbury, Schenectady, N.Y.

[73] Assignee: General Electric Company, Schenectady, N.Y.

[21] Appl. No.: 436,681

[22] Filed: May 8, 1995

Related U.S. Application Data

[63] Continuation of Ser. No. 169,260, Dec. 20, 1993, abandoned.

[51] Int. Cl.[6] .......................... H01L 31/18; H01L 21/26; H01L 1/62
[52] U.S. Cl. .............. 437/3; 437/173; 437/923; 313/498
[58] Field of Search .................... 313/414, 498–512; 29/402.18, 846; 445/24; 359/55, 59, 87, 54; 257/50, 529, 530; 437/173, 3, 246, 923; 148/DIG. 93

[56] References Cited

U.S. PATENT DOCUMENTS

| | | | |
|---|---|---|---|
| 3,597,834 | 8/1971 | Lathrop et al. | 29/846 |
| 4,688,896 | 8/1987 | Castleberry | 359/54 |
| 4,752,118 | 6/1988 | Johnson | 359/54 |
| 4,804,953 | 2/1989 | Castleberry | 345/93 |
| 4,807,973 | 2/1989 | Kawasaki | 359/55 |
| 4,840,459 | 6/1989 | Strong | 359/54 |
| 4,990,460 | 2/1991 | Moriyama | 437/40 |
| 4,991,939 | 2/1991 | Momose et al. | 359/59 |
| 5,045,753 | 9/1991 | Katayama et al. | 313/494 |
| 5,062,690 | 11/1991 | Whetten | 359/59 |
| 5,066,106 | 11/1991 | Sakamoto et al. | 359/59 |
| 5,086,347 | 2/1992 | Ukai et al. | 359/87 |
| 5,153,408 | 10/1992 | Handford et al. | 219/121.64 |
| 5,246,745 | 9/1993 | Baum et al. | 427/586 |
| 5,289,632 | 3/1994 | Chalco et al. | 29/846 |

FOREIGN PATENT DOCUMENTS 269123 6/1988 European Pat. Off. .

Primary Examiner—William L. Sikes
Assistant Examiner—Walter J. Malinowski
Attorney, Agent, or Firm—Donald S. Ingraham; Marvin Snyder

[57] ABSTRACT

A method for repairing address lines in a thin film imager device includes the steps of removing non-conductive material from a selected repair area so as to expose an open circuit defect in a first conductive component and portions of the first conductive component adjoining the defect, and then depositing conductive material to form a second conductive component and to coincidentally form a repair shunt in the selected repair area that is disposed in electrical contact with the adjoining exposed portions of the first conductive component so as to electrically bridge the open circuit defect. Removal of the non-conductive material to form the selected repair area is accomplished with an excimer laser, allowing the formation of a selected repair area having desired dimensions and substantially planar surfaces. Following formation of the repair shunt, any conductive material disposed between the repair shunt and the second conductive component is removed to electrically isolate the repair shunt from the second electrically conductive component.

22 Claims, 2 Drawing Sheets

ADDRESS LINE REPAIR STRUCTURE AND METHOD FOR THIN FILM IMAGER DEVICES

This application is a Continuation of application Ser. No. 08/169,260, filed Dec. 20, 1993, now abandoned.

BACKGROUND OF THE INVENTION

This invention relates generally to thin film electronic imager devices and more particularly to address line structures contained in devices such as solid state radiation imagers having a matrix of electrically conductive address lines for controlling the active components of the device.

Address lines for conducting electrical signals to and from active components in a display or imager device are formed as integral parts of the structure of solid state imagers. These address lines usually form a matrix, with lines running in one direction designated as scan lines and lines disposed in a substantially perpendicular direction designated as data lines. Electrical signals (e.g. the voltage) on a scan line typically control a switching device, such as a field effect transistor (FET, also referred to as a thin film transistor, or TFT), that in turn couples the active component, such as a photosensor, to the data line so that an electrical signal from the photosensor can be read out. A common electrode is disposed over the photosensor array to provide the common contact for each photosensor pixel in the array. The electrical signal that is read out corresponds to the number of detected photons incident on the array, and the signals from the respective photosensors are used to electronically reproduce an image of the photons detected by the array of photosensors.

A defect on a data line can adversely affect overall performance of the thin film imager device. This situation is particularly of concern in imagers in which the data lines have been severed in the middle of the array in order to reduce noise levels. In this arrangement, it is necessary to be able to read the data lines from each side (or edge) of the array, and an open circuit condition effectively disables all pixels connected to the address line beyond the point where the open circuit exists. Some degradation of the number of operative pixels can be tolerated with appropriate software changes in the read out circuits; replacement of the pixel array (which would be anticipated during the life of the imager), however, would necessarily require revision of the readout software, increasing the time and expense of servicing of the imager. Further, an imager having sufficient defective address lines may have to be discarded, depending upon the degradation of the resolution of the display device resulting from the inoperative pixels.

Given the expense of fabricating thin film electronic imager devices, it is desirable to have devices that are repairable. In particular, it is desirable to have a device that is readily repaired without significant additional processing time during fabrication.

It is accordingly an object of this invention to provide a method of repairing address lines in a thin film solid state imager device that increases yield of fabrication processes and that is readily integrated into the fabrication process with few additional steps to effect the repair.

It is another object of the present invention to provide a thin film solid state imager device data line repair structure that is efficacious and the use of which is adapted for easy integration into the imager fabrication process

SUMMARY OF THE INVENTION

In accordance with this invention a method of repairing a defect in a thin film solid state imager device having a plurality of conductive components arranged in respective levels in the device includes the steps of removing material from a selected repair area of the device to expose an open-circuit defect in a damaged first conductive component and selected adjoining portions of the first conductive component; and then depositing conductive material to form a second conductive component and to coincidentally form a repair shunt in the selected repair area. The repair shunt is disposed in electrical contact with the exposed adjoining portions of the first conductive component so as to electrically bridge the defect in the damaged first conductive component. The step of removing material to form the selected repair area and to thus expose the defect and adjoining portions of the first conductive component comprises ablating non-conductive material in the selected repair area with a laser. The laser typically comprises an excimer laser so as to enable the ablation step to leave a substantially planar surface in the selected repair area while leaving the non-conductive material on portions of the first conductive component outside of the selected repair area. In the typical imager device, the first conductive component is a data line comprising molybdenum, titanium, aluminum, chromium, or the like, and the second conductive component is the common electrode comprising indium tin oxide, or the like.

An imager device in accordance with this invention comprises a damaged first conductive component disposed in a first level and having a defect in the electrically conductive material comprising the conductive component, the defect being an open circuit discontinuity in the first conductive component. The imager device further comprises a second conductive component disposed in a second level and comprising a respective electrically conductive material, and a repair shunt disposed in electrical contact with the damaged first conductive component so as to electrically bridge the open-circuit defect in the first conductive component. The repair shunt comprises the second component electrically conductive material. Typically the first conductive component comprises a data line in a photosensor pixel array in the imager device and the second conductive component comprises the common electrode of the photosensor array.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description in conjunction with the accompanying drawings in which like characters represent like parts throughout the drawings, and in which:

DETAILED DESCRIPTION OF THE INVENTION

Figure 1:
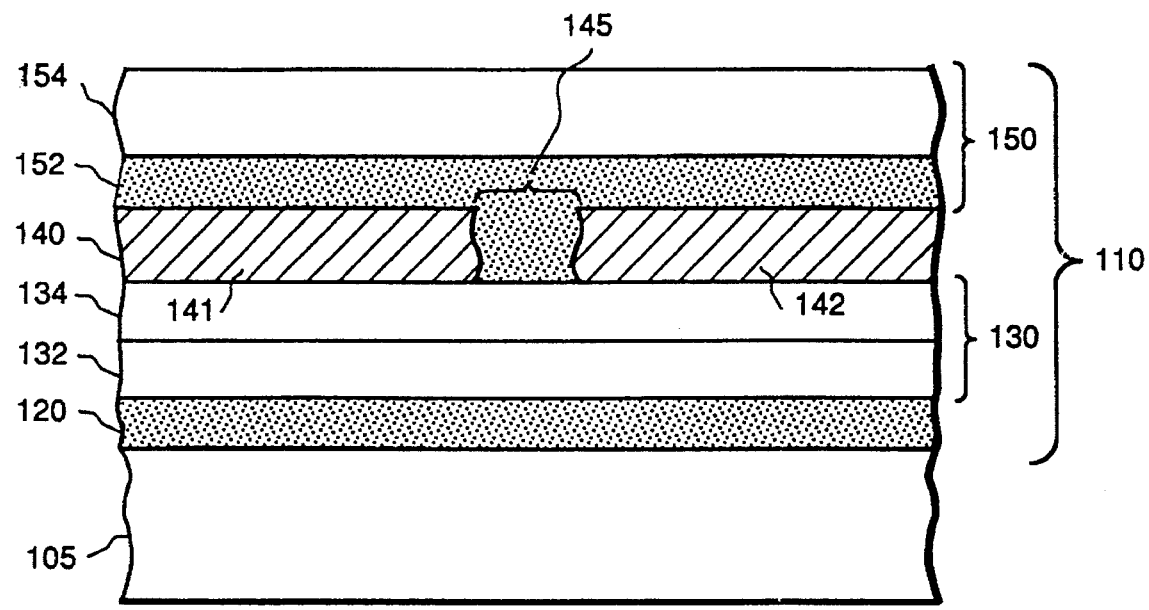
FIG. 1 is a cross-sectional view of an imager device having a damaged first conductive component and illustrated at a point in the fabrication process prior to deposition of an overlying second conductive component.

A thin film electronic imager device 100, such as a solid state radiation imager, typically comprises a photosensor array 110 disposed on a substrate 105, as illustrated in FIG. 1. Photosensor array 110 comprises a plurality of photosensor pixels (not shown), comprising photodiodes or the like, which are sensitive to incident photons. Each pixel is respectively addressed by a matrix of address lines coupled to the pixels; address lines comprise scan lines (not shown) that are coupled to switching devices to access respective pixels, and data lines that conduct charge collected on the photodiode to readout circuitry. The scan and data lines are typically electrically insulated from one another by a dielectric layer disposed between them.

In the fabrication of the photosensor array in a typical imager device, scan lines are formed on substrate 105; a dielectric layer 120 comprising silicon nitride, silicon dioxide, or the like, is deposited over the scan line array; a semiconductive layer 132 comprising silicon or the like is deposited over dielectric layer 120, and a doped semiconductive layer 134 comprising silicon doped to exhibit n type conductivity or the like is deposited over the semiconductive layer. Semiconductive layer 132 and doped semiconductive layer 134 are patterned to form the bodies of switching devices (not shown), such as a field effect transistor (FET) (also referred to as a thin film transistor (TFT)) associated with each pixel. The combined layers of semiconductive layer 132, and doped semiconductive layer 134 are typically referred to collectively as a FET sandwich 130. Conductive material, such as molybdenum, titanium, aluminum, chromium, or the like, is deposited and patterned to form source and drain electrodes (not shown) for each TFT and typically also is patterned to form data lines 140 (a representative one of which is shown in cross section in FIG. 1) in the array.

Additional fabrication steps include formation of the photodiodes, including the deposition and patterning of semiconductive material, typically silicon, to form the photodiode body (not shown in the cross-sectional portion of the imager illustrated in FIG. 1), deposition of a barrier layer 150, which typically comprises a first protective layer comprising an inorganic dielectric material such as silicon dioxide, silicon nitride, or the like, and a second protective layer comprising an organic dielectric material such as polyimide or the like. Fabrication of photosensor array 110 is completed with the deposition and patterning of a common electrode (not illustrated in FIG. 1) disposed over the barrier layer and in electrical contact with a portion of each photosensor body through vias opened in the barrier layer.

FIG. 1 illustrates an imager device at the stage in the fabrication process just prior to the deposition of the common electrode. A defect 145 is disposed in data line 140 such that an open circuit condition exists between a first portion 141 and a second portion 142 of data line 140. Defect 145 comprises a break in the conductive material of data line 140 in which non-conductive material is disposed between respective portions 141, 142, of the data line. The non-conductive material typically comprises dielectric material from barrier layer 150; as used herein, "non-conductive" refers to both dielectric and semiconductive material that may be disposed in defect 145 so as to create the open circuit condition (the term also implies a non-gaseous material, such as a solid or fluid that reposes in the defect region). Defect 145 results from damaged or missing metal for data line 140 such as might occur when there is a defect in the mask used for the deposition or patterning of the conductive material comprising data line 140, or from damage to the conductive line in processing. Alternatively, the defect may be purposely made, such as with a laser to cut the line, in order to isolate a portion of data line 140 shorted to an underlying conductive component, e.g., a scan line, such as at a crossover point between the two types of address lines. The open circuit condition of the data line is typically determined and recorded during inspection of the imager device following formation of the data lines.

In accordance with the present invention, the open-circuit defect 145 in data line 140 is repaired with the use of conductive material that is deposited to form a conductive component on a succeeding level of the device. As used herein, "succeeding level of the device" refers to a conductive component that is formed in the fabrication process following the formation of data line 140, and thus is typically disposed on a different level of the sandwich of materials that are deposited to fabricate the components for the imager device. No restriction on the orientation of the device is to be implied by the terminology relating to levels of the components. As set out above, in the repair of a data line, the next conductive component to be deposited in the fabrication process is typically the common electrode of the photosensor array.

Figure 2:
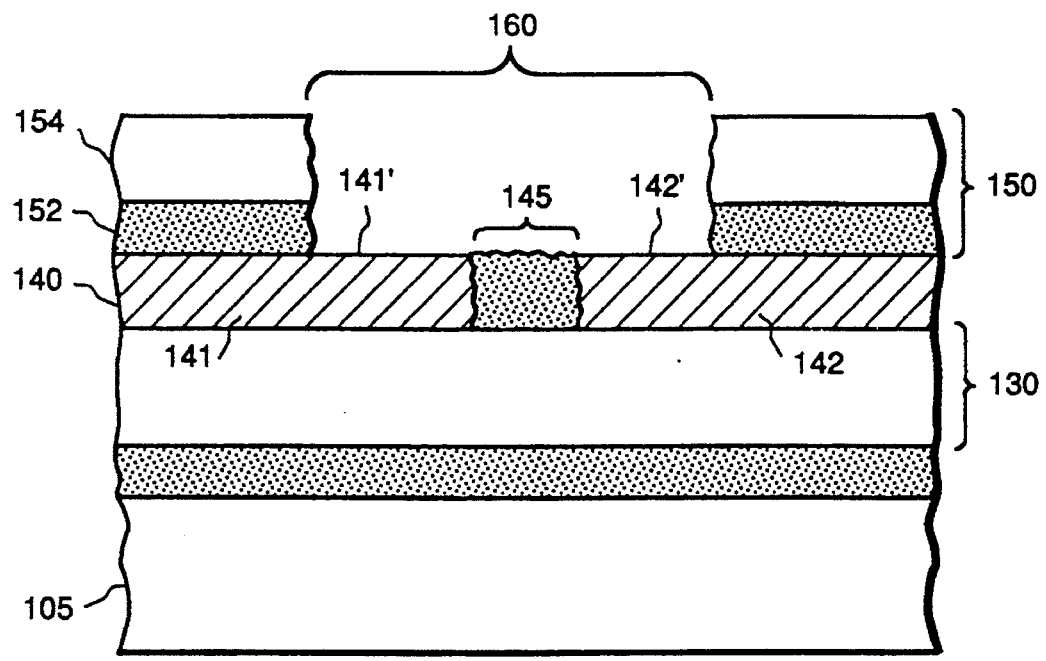
FIG. 2 is a cross-sectional view of an imager device in which the device has been prepared for the deposition of the repair shunt in accordance with the present invention.

Prior to deposition of conductive material to form the common electrode, a selected repair area 160 (FIG. 2) is formed by removing material to expose defect 145 and selected adjoining portions of data line 140. The selected adjoining portions of data line 140 include a first segment 141' of first portion 141 and a second segment 142' of second portion 142 of data line 140, the selected adjoining portions collectively comprising areas on each portion of the data line adjoining by open circuit defect 145. Segments 141' and 142' are sufficiently large to allow the subsequently deposited conductive material to make satisfactory electrical contact to data line 140 and to form a stable structure. In a typical imager in which data line 140 has a width of about 7 μm, segments 141' and 142' each have a length of about 10 μm. As illustrated in FIG. 2, non-conductive material around defect 145 is removed so as to form a substantially planar surface in the selected repair area (that is, some portion of the nonconductive material remains disposed in defect 145 so as to provide a substantially smooth, planar surface between the respective exposed portions 141', 142' of data line 140 ). Additionally, the sidewalls of barrier layer 150 where the non-conductive material has been removed are typically also substantially planar (that is, relatively smooth surfaces that are typically disposed substantially vertically between the bottom surface of selected repair area 160 and the upper surface of barrier layer 150). Alternatively, all or a portion of non-conductive material can be removed from defect 145.

Typically laser ablation is used to remove non-conductive material from selected repair area 160. In particular, an excimer laser provides a finely-focussed beam that is very effective in ablating the non-conductive material without simultaneously ablating other components, such as data line segments 141' and 142'. For example, in a typical imager device structure in which data line 140 comprises molybdenum having a thickness in the range between about 2,000 Å and 10,000 Å (and typically about 4000 Å), first protective layer 152 comprises silicon dioxide having a thickness in the range between about 1,000 Å and 10,000 Å (and typically about 5000 Å), and second protective layer 154 comprises polyimide having a thickness in the range between about 0.8 μm and 2.5 μm (and typically about 1.2 μm), a Florod brand Model LCM 308 excimer laser has been used at about 15% power (total power being about 350 microjoules) to ablate non-conductive material to form selected repair area 160 having dimensions of about 10 μm by 20 μm (width, depth, etc) At the conclusion of the laser ablation step, the portion of damaged data line 140 appears as illustrated in FIG. 2.

Next, the conductive material to form a conductive component on a succeeding level of the device is deposited. For example, a common electrode 170 (FIG. 3) is formed in imager device 100 by depositing a conductive material (for imager devices, this material is deposited to form a substantially optically transparent layer) such as indium tin oxide, or the like using, for example, a sputter process. Alternatively, conductive materials such as aluminum, chromium, or the like is used to form the common electrode;if such non-optically transparent material is used, however, additional process steps are required to pattern the common electrode so that it does not prevent light from reaching large portions of the photodiode surface. Coincidentally with the deposition of common electrode 170, a repair shunt 180 is formed in selected repair area 160 as the same conductive material that is used to form common electrode 170 is deposited over defect 145 and on segments 141' and 142' of data line 140. As illustrated in FIG. 2, repair shunt 180 thus comprises the same conductive material as common electrode 170 and is disposed so as to electrically bridge defect 145 such that first portion 141 and second portion 142 of data line 140 are electrically coupled together. Similarly, the thickness of repair shunt 180 corresponds with the thickness of common electrode 170 as the two components are formed in the same deposition process. Alternatively, dependent on the component being repaired, the conductive material deposited to form the repair shunt may be the same as the conductive material of the underlying component in which the defect exists.

Figure 3:
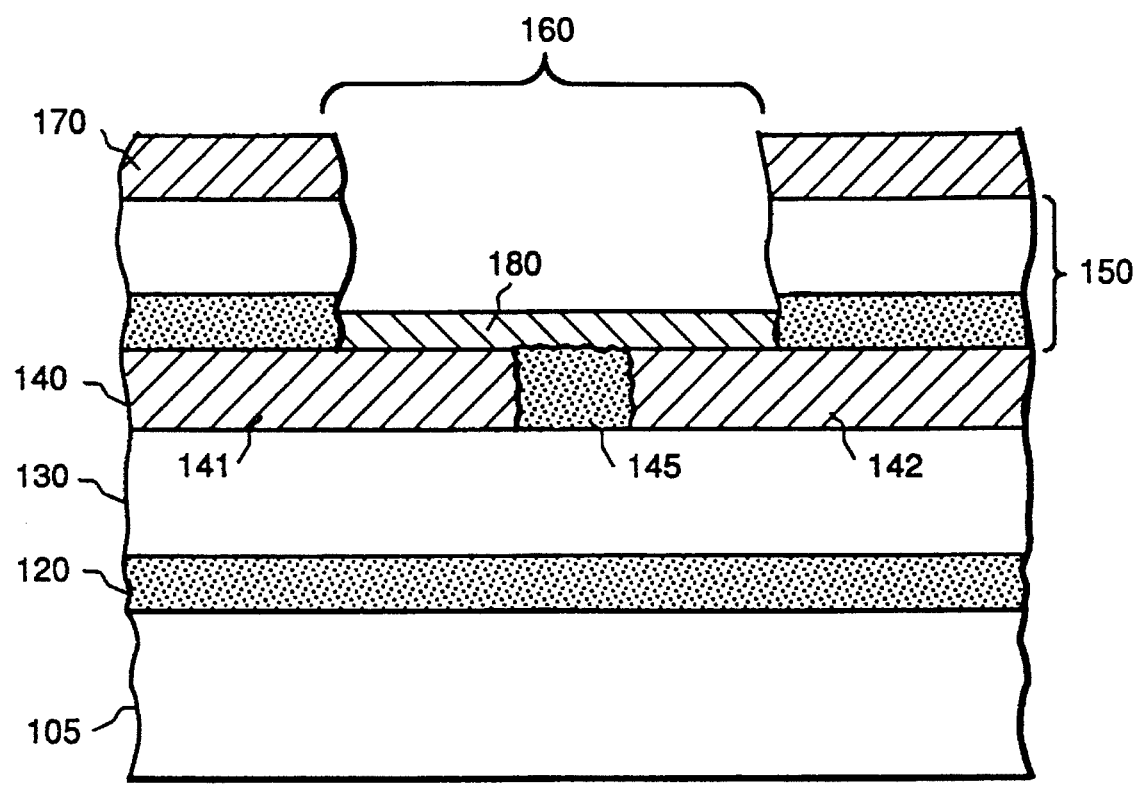
FIG. 3 is a cross-sectional view of an imager device after deposition of the repair shunt in accordance with the present invention.

As illustrated in FIG. 3, repair shunt 180 is substantially planar, which is desirable from the standpoint of structural integrity when using a conductive material such as indium tin oxide or the like. Alternatively, repair shunt 180 can be disposed in-between first portion 141 and second portion 142 of data line 140 in addition to, or alternatively, in lieu of, being disposed on the upper surfaces of segments 141' and 142', so long as adequate electrical contact is made to bridge the open circuit between first and second data line portions 141, 142.

Following formation of repair shunt 180, any conductive material coupling repair shunt 180 to common electrode 170 is removed so as to electrically isolate repair shunt 180 from common electrode 170. Removal of such conductive material (as may be adhering to sidewalls of barrier layer 150 in selected repair area 160) is typically accomplished with laser ablation, particularly with the use of an excimer laser for the reasons set out above.

Following completion of the repair, that is the formation of repair shunt 180 and electrically isolating the repair shunt from common electrode 170, a passivation layer (not shown) comprising, for example, silicon nitride, silicon dioxide, or the like, is deposited over common electrode 170, repair shunt 180, and the exposed sidewalls of protective layer 150 in selected repair area 160.

The procedure of this invention thus enables data lines to be readily repaired during the fabrication process of an imager device with a procedure that does not require any additional masks or photolithographic steps; is readily adapted for repair of multiple defects in a particular line and repair of multiple damaged data lines; and provides a relatively low resistance repair shunt structure of the transparent conductive oxide material (e.g., providing a shunt with a resistance in the range of 100 Ω to 500 Ω) that are appropriate for repair of address lines in imager arrays in which low resistance on address lines is critical for maintaining low noise operation of the imager device.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A thin film electronic imager device having a plurality of conductive components disposed in respective levels, the imager device comprising:

a damaged first conductive component disposed in a first level and comprising a respective first electrically conductive material having a defect therein, said defect comprising an open circuit discontinuity in said first electrically conductive material;

a second conductive component disposed in a succeeding level with an intermediate layer of non-conductive material disposed between said first and second conductive component, said second conductive component comprising a respective second electrically conductive material different from said first conductive material;

a repair area disposed over said open circuit discontinuity in said first conductive component, said repair area having substantially vertical sidewalls across said intermediate non-conductive material layer such that portions of said second electrically conductive material deposited over said intermediate non-conductive material layer are disposed in said repair area over said open circuit discontinuity so as to form a repair shunt, said repair shunt being electrically isolated from said second conductive component;

said repair shunt being disposed in electrical contact with said damaged first conductive component so as to electrically bridge said defect in said damaged first conductive component.

2. The device of claim 1 wherein said repair shunt comprises a substantially planar layer of said second component electrically conductive material disposed so as to electrically contact the upper surface of said first conductive component in the region adjoining said defect.

3. The device of claim 2 wherein the thickness of said repair shunt corresponds to the thickness of the second conductive component.

4. The device of claim 2 further comprising a non-conductive material disposed in said defect between edges of said first conductive component facing said defect, the upper surface of said non-conductive material in said defect being substantially planar with adjoining upper surfaces of said first conductive component.

5. The device of claim 4 wherein said non-conductive material disposed in said defect comprises an inorganic dielectric material.

6. The device of claim 1 wherein said second component electrically conductive material comprising said repair shunt is disposed in-between edges of said first conductive component facing said defect.

7. The device of claim 1 wherein said first conductive component comprises an address line.

8. The device of claim 7 wherein said first component conductive material is selected from the group consisting of molybdenum, titanium, aluminum and chromium.

9. The device of claim 8 wherein said second conductive component comprises a common electrode disposed over said imager device.

10. The device of claim 9 wherein said second component conductive material comprises a material selected from the group consisting of indium tin oxide, aluminum, and chromium.

11. A method of repairing a defect in a thin film electronic imager device having a plurality of conductive components disposed in respective levels in the device, the method comprising the steps of:

forming a selected repair area on said device, said selected repair area being disposed so as to expose an open-circuit defect in a damaged first conductive component and selected adjoining portions of said first conductive component; and depositing conductive material to form a second and succeeding conductive component disposed over said first conductive component and to coincidentally form a repair shunt in said selected repair area disposed in electrical contact with said damaged first conductive component so as to electrically bridge said defect in said damaged first conductive component, said repair shunt being electrically isolated from said second conductive component.

12. The method of claim 11 wherein the step of forming a selected repair area comprises the step of ablating conductive material disposed over said first conductive component in said selected repair area with a laser.

13. The method of claim 12 wherein the step of ablating said selected repair area comprises the step of removing nonconductive material disposed in-between portions of said first conductive component adjoining said defect.

14. The method of claim 12 wherein the step of ablating said selected repair area further comprises leaving in place non-conductive material outside of said selected repair area.

15. The method of claim 12 wherein said laser comprises an excimer laser.

16. The method of claim 15 wherein the step of ablating non-conductive material in said selected repair area comprises the step of ablating material to form a substantially planar surface in said selected repair area.

17. The method of claim 16 wherein the step of depositing conductive material to form said repair shunt comprises the step of disposing a substantially planar layer of the conductive material over said selected repair area.

18. The method of claim 11 further comprising the step of removing conductive material disposed between said second conductive component and said repair shunt.

19. The method of claim 11 wherein said first conductive component comprises an address line.

20. The method of claim 19 wherein said address line comprises a material selected from the group consisting of molybdenum, titanium, aluminum and chromium.

21. The method of claim 19 wherein said second conductive component comprises a common electrode disposed over said imager device.

22. The method of claim 21 wherein said common electrode comprises a material selected from the group comprising indium tin oxide, aluminum, and chromium.

* * * * *